(12) United States Patent
Marshall

(10) Patent No.: US 8,258,868 B2
(45) Date of Patent: Sep. 4, 2012

(54) DIFFERENTIAL INPUT FOR AMBIPOLAR DEVICES

(75) Inventor: Andrew Marshall, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/943,758

(22) Filed: Nov. 10, 2010

(65) Prior Publication Data

US 2012/0112822 A1 May 10, 2012

(51) Int. Cl.
  *H03F 3/45* (2006.01)
(52) U.S. Cl. ......................................... 330/253; 330/257
(58) Field of Classification Search .................. 330/253, 330/257, 255, 261
  See application file for complete search history.

(56) References Cited

U.S. PATENT DOCUMENTS

| 4,581,593 A * | 4/1986 | Okanobu ................ 331/116 R |
| 6,137,363 A * | 10/2000 | Miki et al. .................. 330/255 |
| 6,600,372 B2 * | 7/2003 | Prentice ........................ 330/254 |
| 6,965,267 B2 * | 11/2005 | Delorme et al. ............... 330/257 |
| 7,554,364 B2 * | 6/2009 | Alenin et al. .................. 326/109 |
| 7,687,308 B2 | 3/2010 | Parikh et al. |
| 7,812,370 B2 | 10/2010 | Bhuwalka et al. |
| 2008/0290941 A1 | 11/2008 | Ludwig |

OTHER PUBLICATIONS

"Triple-Mode Single-Transistor Graphene Amplifier and Its Applications," ACS Nano, vol. 4, No. 10, Oct. 12, 2010, pp. 5532-5538 (Xuebei Yang, Guanxiong Liu, Alexander Balandin and Kartik Mohanram).

* cited by examiner

*Primary Examiner* — Henry Choe
(74) *Attorney, Agent, or Firm* — John J. Patti; Wade J. Brady, III; Frederick J. Telecky, Jr.

(57) ABSTRACT

Differential input pairs have been used in analog electronics with both CMOS and bipolar transistors for many years. Conventional designs for differential input pairs, though, may not be suitable for emerging technology transistors, such as graphene transistors, carbon nanotube (CNT) transistors, or other ambipolar transistors. Here, a differential input pair has been provided that uses ambipolar transistors, which accounts for the more unusual I-V (drain current to gate-source voltage) characteristics of ambipolar transistors.

5 Claims, 6 Drawing Sheets

DIFFERENTIAL INPUT FOR AMBIPOLAR DEVICES

TECHNICAL FIELD

The invention relates generally to a differential input pair and, more particularly, to a differential input pair that uses ambipolar transistors.

BACKGROUND

Turning to FIG. 1, a conventional operational amplifier 100 can be seen. The amplifier 100 generally comprises a current mirrors 102 and 108, a differential input pair 104, and an output circuit 106. The current mirrors 102 and 108 generally and respectively comprise transistors Q3 and Q4 (which, as shown, are PMOS transistors) and transistors Q5, Q6, and Q8 (which, as shown, are NMOS transistors). The differential input pair 104 generally comprises transistors Q1 and Q2 (which, as shown, are NMOS transistors or can be NPN transistors that receive input signal INP and INM). The output circuit 106 generally comprises transistors Q7 (which, as shown, are a PMOS transistor and an NMOS transistor, respectively). Additionally, bias voltage BIAS can be applied to the gates of each of transistors Q5, Q6, and Q8. Each of the transistors Q1 through Q8 used also exhibits "normal" behavior, as shown in FIG. 2, where the drain current ID remains relatively constant at large gate-source voltages VGS and increases (almost linearly) at low gate-source voltages VGS.

In FIG. 3, an example of the general operation for amplifier 100 can be seen. For this example, the supply voltage VDD is 1.5V and a voltage of 0.75V is applied as signal INP to transistor Q1. As the voltage for signal INM is ramped, as shown, the output signal VOUT remains at 1.5V until 0.75V is reached. When signal INM reaches 0.75V, output signal VOUT transitions from 1.5V to 0V, allowing amplifier 100 to operate as a comparator.

While the circuitry of FIG. 1 is well-known and has been used for CMOS transistors for many years, there are emerging technologies that have characteristics that may interfere with the desired performance of similar circuits. Turning to FIG. 4, an example of an emerging technology transistor 400 can be seen; namely, transistor 600 is a graphene. An example of the structure and formation of a graphene or carbon nanotube (CNT) transistor can be found in U.S. Pat. No. 7,687,308, which is incorporated herein by reference for all purposes. Alternatively, an example of the structure and formation of a TFET can be found in U.S. Pat. No. 7,812,370, which is incorporated herein by reference.

Here, FIG. 4 shows a simplified example of a cross sectional view of a graphene transistor 400. Similar to CMOS transistors, graphene transistors have a source, drain, and gate. As shown, the transistors 400 is formed over a dielectric layer 404 on a substrate 402. The source and drain electrodes 406 and 408 are opposite one another with the graphene sheet or CNT 410 formed therebetween. The graphene sheet 410 generally operates as the channel of transistor 400, so a gate dielectric layer 412 is formed between the graphene sheet 412 and gate electrode 414 (similar to a CMOS transistor).

The behavior of transistor 400, however, is completely different than CMOS transistor. Transistor 400 operates as an ambipolar transistor, and the I-V characteristics of transistor 400 can be seen in FIG. 5. When comparing FIG. 4 to FIG. 2, it can easily be observed that developing circuitry for ambipolar transistors (i.e., transistor 400) having similar behavior to known circuitry in CMOS (or bipolar) can be challenging. Accordingly, there is a need for a differential input pair using ambipolar transistors.

Some conventional circuits are: U.S. Patent Pre-Grant Publ. No. 2008/0290941; and Yang et al., "Triple-Mode Single-Transistor Graphene Amplifier and Its Applications," ACS Nano, Vol. 4, No. 10, Oct. 12, 2010, pp. 5532-5538.

SUMMARY

A preferred embodiment of the present invention, accordingly, provides an apparatus. The apparatus comprises a differential input pair of ambipolar transistors having a first input terminal and a second input terminal; and a correction circuit that is coupled to the first and second input terminals and that receives an input signal, wherein the correction circuit adjusts the voltage applied to the first and second input terminals so as to allow the pair of ambipolar transistors to operate in a stable region.

In accordance with a preferred embodiment of the present invention, the correction further comprises: a first resistor that is coupled to the first input terminal; a second resistor that is coupled to the second input terminal; and a pair of cross-coupled diodes coupled between the first and second input terminals.

In accordance with a preferred embodiment of the present invention, each ambipolar transistor from the pair of ambipolar transistors further comprises a graphene transistor, a carbon nanotube (CNT) transistor, or a tunneling field effect transistor (TFET).

In accordance with a preferred embodiment of the present invention, each ambipolar transistor from the pair of ambipolar transistors are approximately the same size.

In accordance with a preferred embodiment of the present invention, an apparatus is provided. The apparatus comprises a first current mirror; a differential input pair of ambipolar transistors that is coupled to the first current minor, wherein the differential input pair of ambipolar transistors has a first input terminal and a second input terminal; a correction circuit that is coupled between the first and second input terminals and that receives an input signal, wherein the correction circuit adjusts the voltage applied to the first and second input terminals so as to allow the pair of ambipolar transistors to operate in a stable region; and a second current minor that is coupled to the differential input pair of ambipolar transistors.

In accordance with a preferred embodiment of the present invention, an apparatus is provided. The apparatus comprises a first voltage rail; a second voltage rail; a first current minor including: a first current minor transistor having a first passive electrode, a second passive electrode, and a control electrode, wherein the first passive electrode of the first current minor transistor is coupled to the first voltage rail; and a second current mirror transistor having a first passive electrode, a second passive electrode, and a control electrode, wherein the first passive electrode of the second current mirror transistor is coupled to the first voltage rail, and wherein the second passive electrode and control electrode of the second current minor transistor are each coupled to the control electrode of the first current minor transistor; a differential input pair including: a first ambipolar transistor that is coupled to the second passive electrode of the first current minor transistor at its drain; and a second ambipolar transistor that is coupled to the second passive electrode of the second current minor transistor at its drain and the source of the first ambipolar transistor at its source; a correction circuit including: a first resistor that is coupled to the gate of the first ambipolar transistor and that receives a first portion of an input signal; a second resistor that is coupled to the gate of the second ambipolar transistor and that receives a second portion of the input signal; a first diode that is coupled to the gate of the first ambipolar transistor at its anode and to the gate of the second ambipolar transistor at its cathode; and a second diode that is coupled to the gate of the second ambipolar transistor at its anode and the gate of the first ambipolar transistor at its cathode; and a second current mirror having: a third current minor transistor having a first passive electrode, a second passive electrode, and a control electrode, wherein the first passive electrode of the bias transistor is coupled to the sources of the first and second ambipolar transistors, and wherein the second passive electrode of the bias transistor is coupled to the second voltage rail; a fourth current mirror transistor having a first passive electrode, a second passive electrode, and a control electrode, wherein the first passive electrode and the control electrode of the fourth transistor receive a bias voltage, and wherein the control electrode of the fourth current minor transistor is coupled to the control electrode of the third current mirror electrode, and wherein the second passive electrode of the fourth current mirror transistor is coupled to the second voltage rail.

In accordance with a preferred embodiment of the present invention, the apparatus further comprises an output stage including an output transistor having a first passive electrode, a second passive electrode, and a control electrode, wherein the first passive electrode of the output transistor is coupled to the first voltage rail, and wherein the control electrode of the output transistor is coupled to the drain of the first ambipolar transistor, and wherein the second current minor further comprises a fifth current minor transistor having a first passive electrode, a second passive electrode, and a control electrode, wherein the first passive electrode of the fifth current minor transistor is coupled to the second passive electrode of the output transistor, and wherein the second passive electrode of the fifth current minor transistor is coupled to the second voltage rail, and wherein the control electrode of the fifth current minor transistor is coupled to the control electrode of the fourth current minor transistor.

In accordance with a preferred embodiment of the present invention, the first current minor transistor, the second current minor transistor, and the first output transistor further comprise PMOS transistors, and wherein the third, fourth, and fifth current minor transistors further comprise NMOS transistors.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
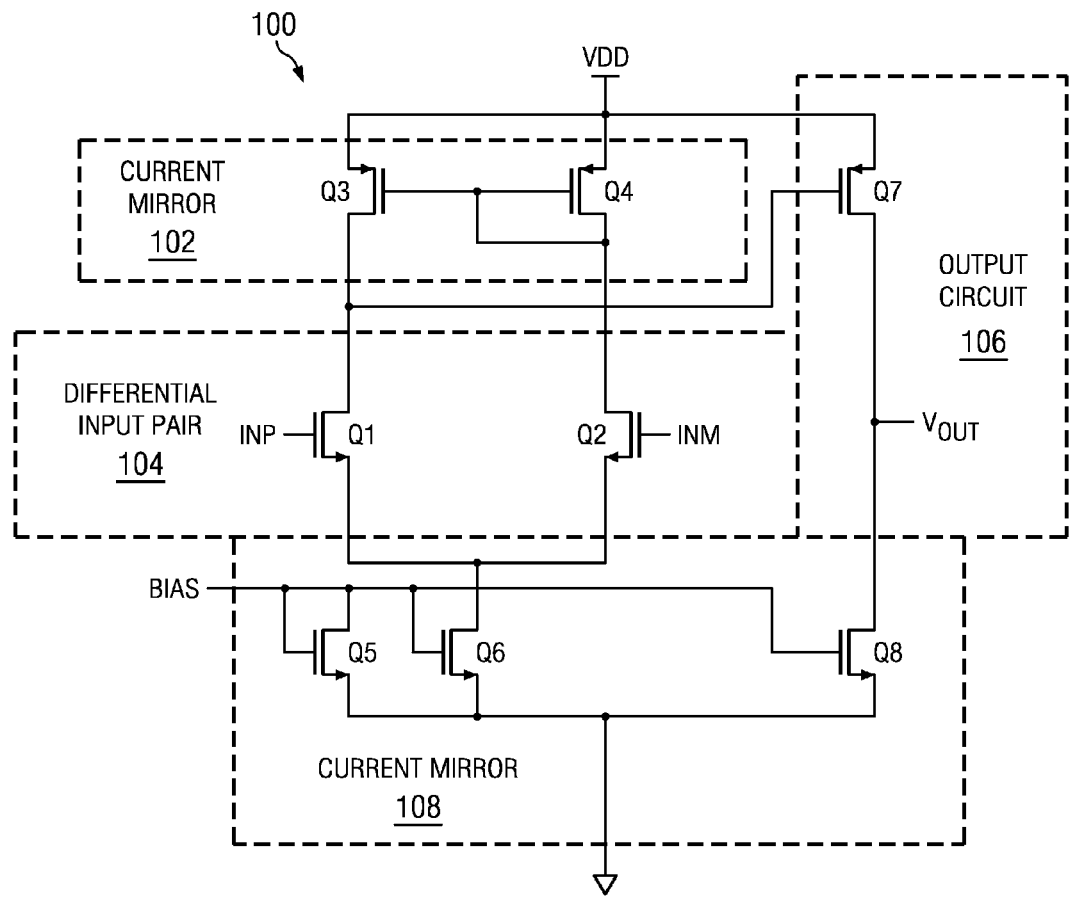
FIG. 1 is a diagram of an example of a conventional amplifier.
Figure 2:
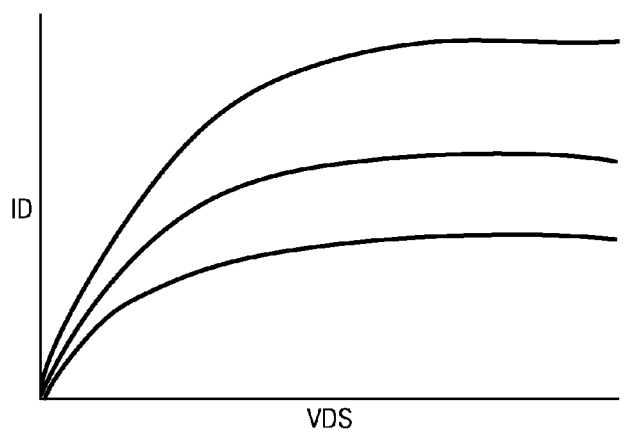
FIG. 2 is a diagram depicting the drain current versus gate-source voltage characteristics of a conventional NMOS transistor.
Figure 3:
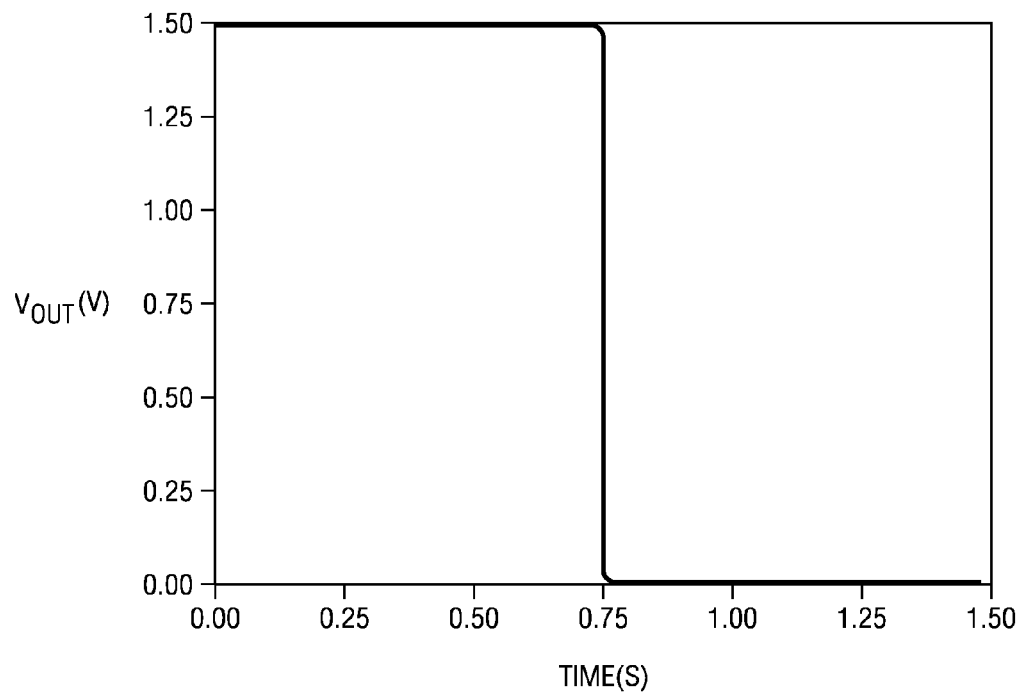
FIG. 3 is a diagram depicting an example of the DC or low frequency operation of the amplifier of FIG. 1.
Figure 3:
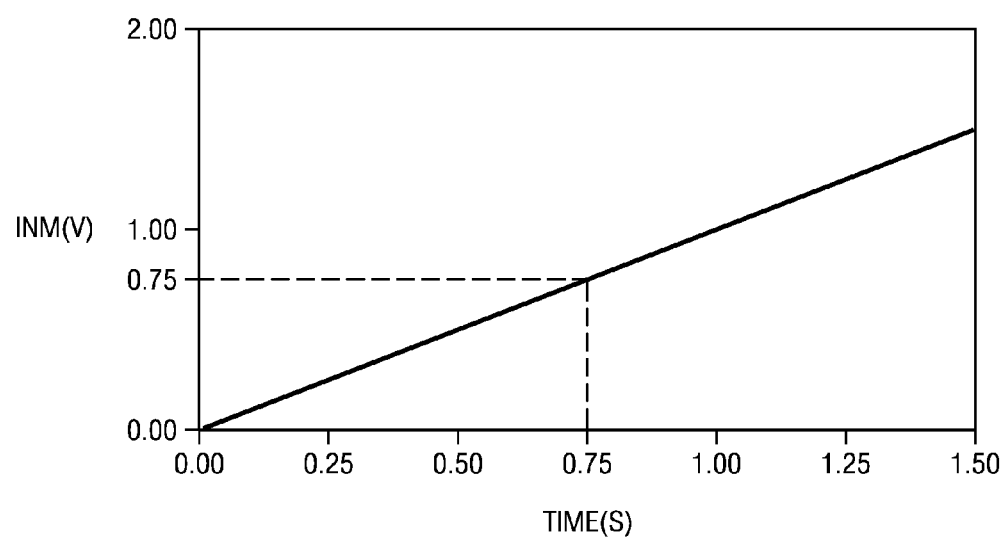
Figure 4:
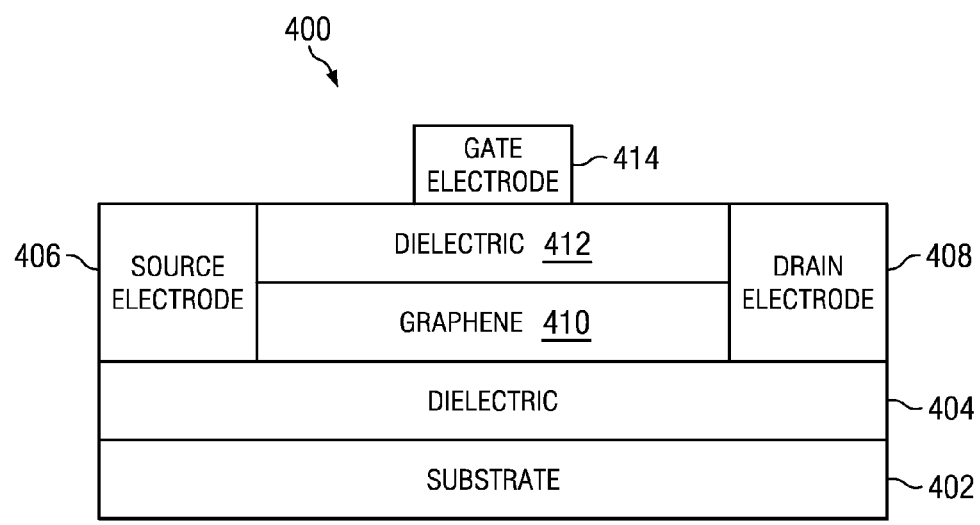
FIG. 4 is a diagram depicting an example of a graphene transistor.

Refer now to the drawings wherein depicted elements are, for the sake of clarity, not necessarily shown to scale and wherein like or similar elements are designated by the same reference numeral through the several views.

Figure 6:
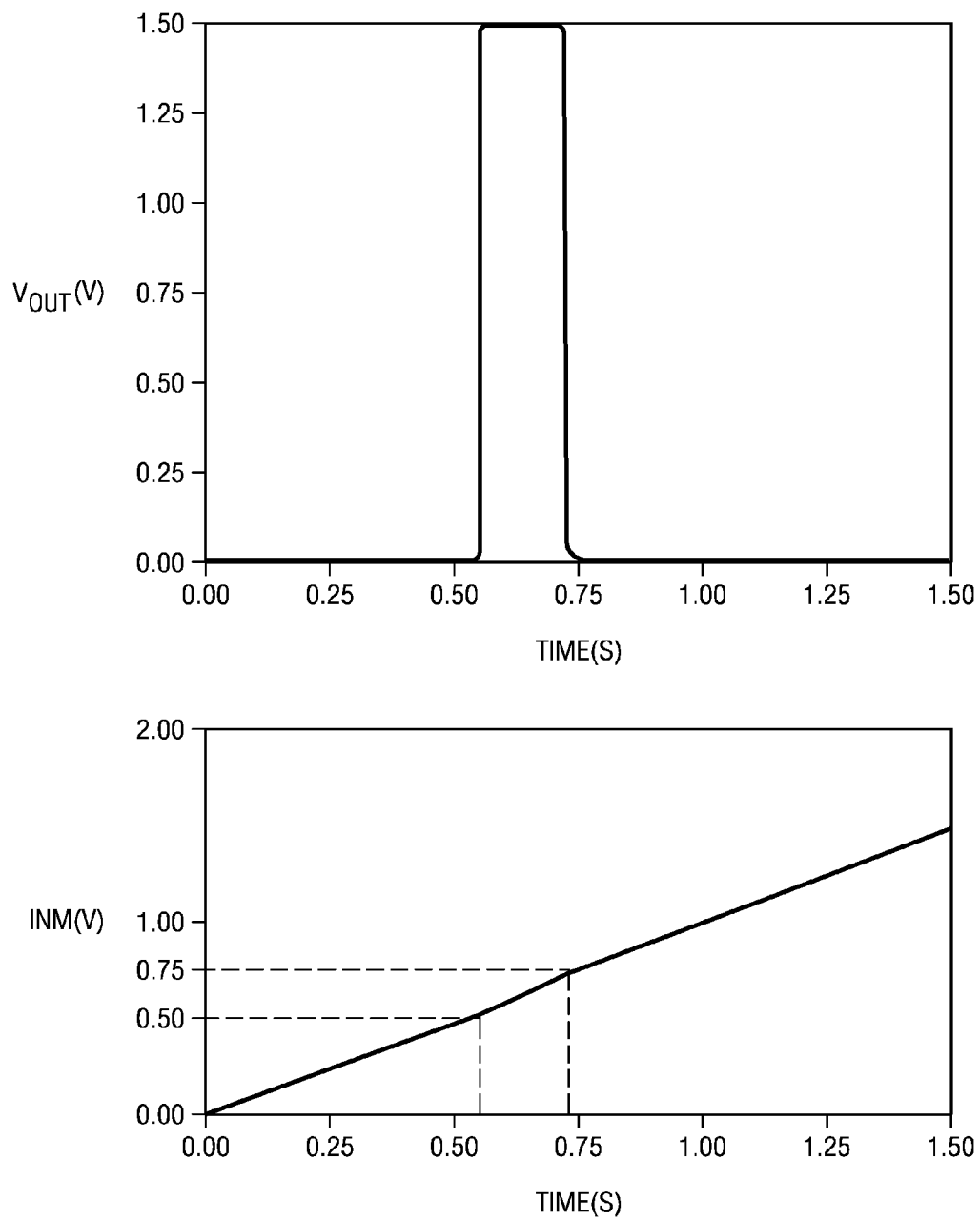
FIG. 6 is a diagram depicting an example of the operation of the amplifier of FIG. 1 where the NMOS differential pair has been replaced with ambipolar transistors.

Turning to FIG. 6, an example of the general operation for amplifier 100 (where transistors Q1 and Q2 have been replaced by ambipolar transistors) can be seen. For this example, the supply voltage VDD is 1.5V and a voltage of 0.75V is applied as signal INP to the ambipolar transistor that replaces transistor Q1. As the voltage for signal INM is ramped, as shown, the output signal VOUT remains 0V until 0.5V is reached. When signal INM reaches 0.5V, output signal VOUT transitions from 0V to 1.5V. The output signal VOUT then transitions back to 0V when signal INM becomes 0.75V. Thus, an amplifier 100 (where transistors Q1 and Q2 have been replaced by ambipolar transistors) does not behave like an ordinary amplifier (i.e., amplifier 100). This unusual behavior can be attributed to the I-V characteristics of the ambipolar transistors. Namely when the gate-source voltage for the ambipolar transistor that replaced transistor Q2 is low (i.e., between 0V and 0.5V), the drain current for this ambipolar transistor is high, meaning that the output signal VOUT should be 0V.

Figure 7:
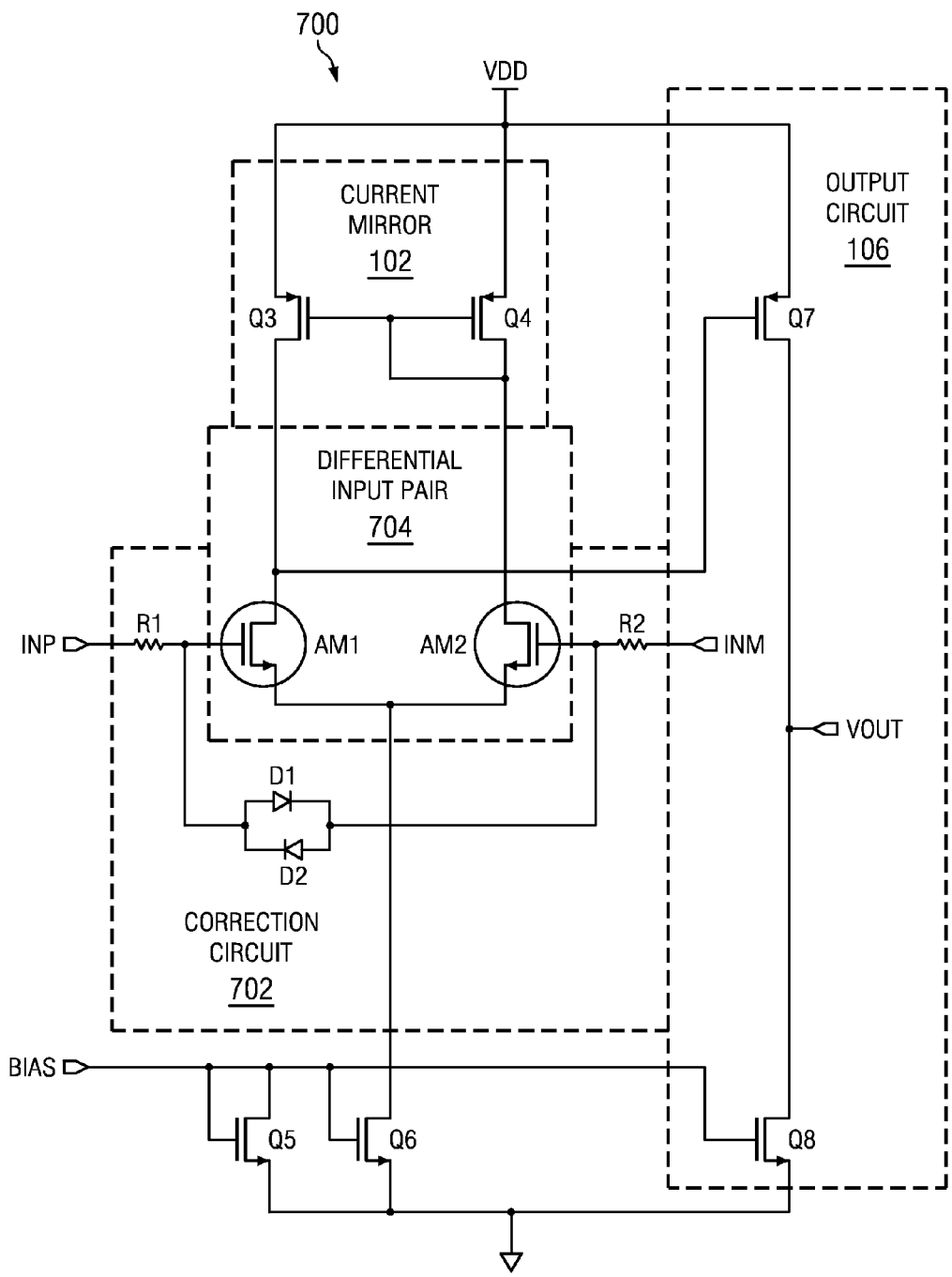
FIG. 7 is a diagram depicting an example of an amplifier using ambipolar transistors in accordance with a preferred embodiment of the present invention.

To address this issue, a correction circuit 702 (which can be seen in FIG. 7) can be employed. As shown for amplifier 700 of FIG. 7, differential pair 104 has been replaced by differential pair 704 and correction circuit 702 is coupled to the gates (or input terminals of differential pair 704) of ambipolar transistors AM1 and AM2 (which can be graphene transistors, CNT transistors, or TFETs). This correction circuit 702 generally comprises resistors R1 and R2 and cross-coupled diodes D1 and D2, and this correction circuit 702 allows the ambipolar transistors to operate in a "stable" region or a region of their I-V curve that allows the differential pair 702 to operate like differential pair 104. Typically, diodes D1 and D2 can adjust the gate-source voltages of ambipolar transistors AM1 and AM2 so as to avoid the wide differential voltages where the ambipolar components can be activated in reverse mode. (as shown in the I-V curve of FIG. 5) when the difference in input voltage is low, the gate-source voltage is also low, and no current flows through resistor R1 and R2. When the input voltage difference is relatively high, resistors R1 and R2 act as current limiting components.

Figure 5:
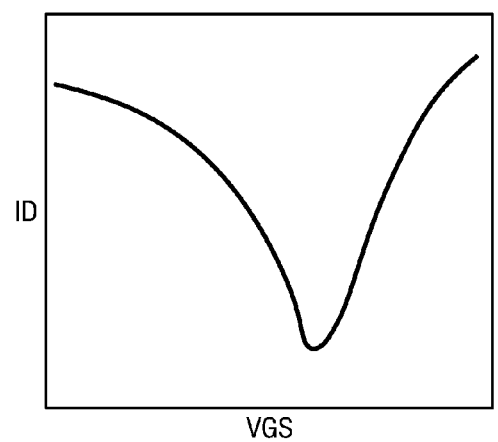
FIG. 5 is a diagram depicting the drain current versus gate-source voltage characteristics of the transistor of FIG. 4.
Figure 8:
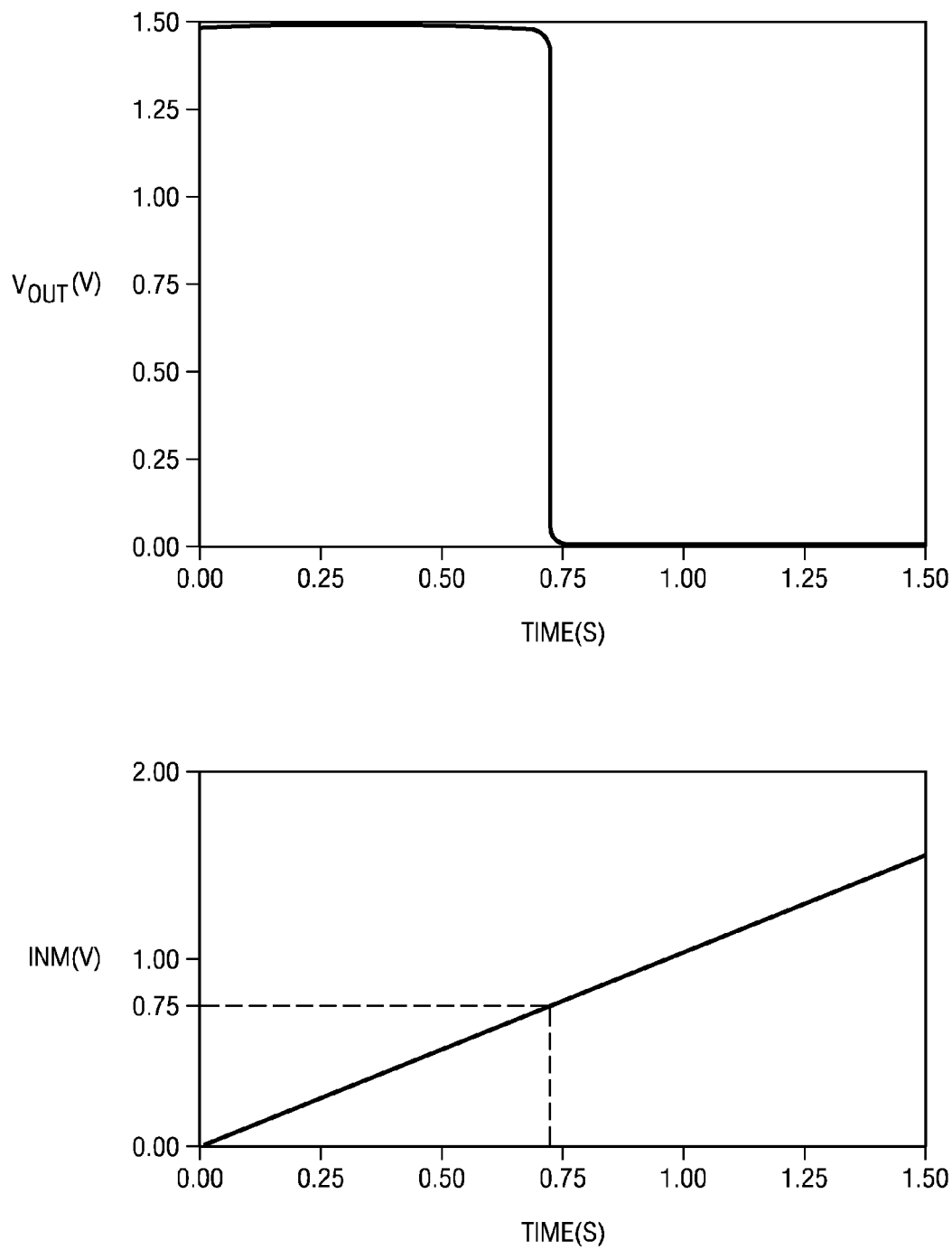
FIG. 8 is a diagram depicting an example of the operation of the amplifier of FIG. 7.

Turning to FIG. 8, an example of the general operation for amplifier 700 can be seen. For this example, the supply voltage VDD is 1.5V and a voltage of 0.75V is applied as signal INP to the ambipolar transistor AM1. As the voltage for signal INM is ramped from 0V to 0.75V, resistor R2 generally prevents current from being sourced through diode D2, and voltage is applied to the gate of ambipolar transistor AM2 through diode D1 so that the drain current of ambipolar transistor AM2 is near the "valley" of its I-V curve (drain current to gate-source voltage) as shown in FIG. 5. By having a large drain current for ambipolar transistor Q1 and a low drain current for ambipolar transistor AM2, the output signal VOUT is at 1.5V, as shown in this example, until the signal INM reaches 0.75V. When the signal INM reaches 0.75V, the output signal VOUT can then transition to 0V. Thus, amplifier 700 can operate in a similar manner to amplifier 100.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   a first voltage rail;
   a second voltage rail;
   a first current mirror including:
      a first current mirror transistor having a first passive electrode, a second passive electrode, and a control electrode, wherein the first passive electrode of the first current mirror transistor is coupled to the first voltage rail; and
      a second current mirror transistor having a first passive electrode, a second passive electrode, and a control electrode, wherein the first passive electrode of the second current mirror transistor is coupled to the first voltage rail, and wherein the second passive electrode and control electrode of the second current mirror transistor are each coupled to the control electrode of the first current mirror transistor;
   a differential input pair including:
      a first ambipolar transistor that is coupled to the second passive electrode of the first current mirror transistor at its drain; and
      a second ambipolar transistor that is coupled to the second passive electrode of the second current mirror transistor at its drain and the source of the first ambipolar transistor at its source;
   a correction circuit including:
      a first resistor that is coupled to the gate of the first ambipolar transistor and that receives a first portion of an input signal;
      a second resistor that is coupled to the gate of the second ambipolar transistor and that receives a second portion of the input signal;
      a first diode that is coupled to the gate of the first ambipolar transistor at its anode and to the gate of the second ambipolar transistor at its cathode; and
      a second diode that is coupled to the gate of the second ambipolar transistor at its anode and the gate of the first ambipolar transistor at its cathode; and
   a second current mirror having:
      a third current mirror transistor having a first passive electrode, a second passive electrode, and a control electrode, wherein the first passive electrode of the bias transistor is coupled to the sources of the first and second ambipolar transistors, and wherein the second passive electrode of the bias transistor is coupled to the second voltage rail;
      a fourth current mirror transistor having a first passive electrode, a second passive electrode, and a control electrode, wherein the first passive electrode and the control electrode of the fourth transistor receive a bias voltage, and wherein the control electrode of the fourth current mirror transistor is coupled to the control electrode of the third current mirror electrode, and wherein the second passive electrode of the fourth current mirror transistor is coupled to the second voltage rail.

2. The apparatus of claim 1, wherein the apparatus further comprises an output stage including an output transistor having a first passive electrode, a second passive electrode, and a control electrode, wherein the first passive electrode of the output transistor is coupled to the first voltage rail, and wherein the control electrode of the output transistor is coupled to the drain of the first ambipolar transistor, and wherein the second current mirror further comprises a fifth current mirror transistor having a first passive electrode, a second passive electrode, and a control electrode, wherein the first passive electrode of the fifth current mirror transistor is coupled to the second passive electrode of the output transistor, and wherein the second passive electrode of the fifth current mirror transistor is coupled to the second voltage rail, and wherein the control electrode of the fifth current mirror transistor is coupled to the control electrode of the fourth current mirror transistor.

3. The apparatus of claim 2, wherein each ambipolar transistor from the pair of ambipolar transistors further comprises a graphene transistor, a carbon nanotube (CNT) transistor, or a tunneling field effect transistor (TFET).

4. The apparatus of claim 3, wherein the first current mirror transistor, the second current mirror transistor, and the first output transistor further comprise PMOS transistors, and wherein the third, fourth, and fifth current mirror transistors further comprise NMOS transistors.

5. The apparatus of claim 3, wherein the first and second ambipolar transistors are approximately the same size.

* * * * *